US012620797B2

(12) United States Patent
Naidu et al.

(10) Patent No.: US 12,620,797 B2
(45) Date of Patent: May 5, 2026

(54) COMPUTER-IMPLEMENTED METHOD OF POWER LINE PROTECTION, INTELLIGENT ELECTRONIC DEVICE AND ELECTRIC POWER SYSTEM

(71) Applicant: Hitachi Energy Ltd, Zürich (CH)

(72) Inventors: Od Naidu, Karnataka (IN); Dinesh Patil, Karnataka (IN); Neethu George, Karnataka (IN); Vedanta Pradhan, Bhubaneswar (IN); Suresh Maturu, Pradesh (IN)

(73) Assignee: HITACHI ENERGY LTD, Zurich (CH)

( * ) Notice: Subject to any disclaimer, the term of this patent is extended or adjusted under 35 U.S.C. 154(b) by 451 days.

(21) Appl. No.: 18/025,031

(22) PCT Filed: Apr. 22, 2022

(86) PCT No.: PCT/EP2022/060654
§ 371 (c)(1),
(2) Date: Mar. 7, 2023

(87) PCT Pub. No.: WO2022/223759
PCT Pub. Date: Oct. 27, 2022

(65) Prior Publication Data
US 2024/0030696 A1 Jan. 25, 2024

(30) Foreign Application Priority Data

Apr. 23, 2021 (IN) .............................. 202141018766
Jun. 11, 2021 (EP) ..................................... 21179002

(51) Int. Cl.
*H02H 1/00* (2006.01)
*G01R 31/08* (2020.01)
*H02H 7/26* (2006.01)

(52) U.S. Cl.
CPC ......... *H02H 1/0092* (2013.01); *G01R 31/088* (2013.01); *H02H 7/26* (2013.01)

(58) Field of Classification Search
None
See application file for complete search history.

(56) References Cited

U.S. PATENT DOCUMENTS

| | | | |
|---|---|---|---|
| 4,812,995 A | 3/1989 | Girgis et al. | |
| 2016/0308349 A1 | 10/2016 | Sridharan et al. | |
| 2021/0382103 A1* | 12/2021 | Rajapakse | ............ G01R 31/085 |

FOREIGN PATENT DOCUMENTS

| | | |
|---|---|---|
| CN | 106856322 B | 6/2017 |
| CN | 109038516 A | 12/2018 |

(Continued)

OTHER PUBLICATIONS

Machine Translation of CN 106856322 A (Year: 2017).*

(Continued)

*Primary Examiner* — Ryan A Jarrett

(74) *Attorney, Agent, or Firm* — PROCOPIO, CORY, HARGREAVES & SAVITCH LLP

(57) ABSTRACT

Techniques for distance protection of a transmission line include determining a fault inception time from a voltage and/or current, determining rate of change sample values indicative of a rate of change of the voltage and/or of a rate of change of the current for at least one sample time that is dependent on the fault inception time, and using the rate of change sample values to generate a phase classifier for fault classification of a zone classifier for faulted zone identification.

18 Claims, 6 Drawing Sheets

(56)                         References Cited

FOREIGN PATENT DOCUMENTS

| EP | 3757581 | A1 | 12/2020 |
| JP | 2001-268798 | A | 9/2001 |
| JP | 2014-093823 | A | 5/2014 |
| JP | 2016-224050 | A | 12/2016 |

OTHER PUBLICATIONS

Ebron et al., "A Neutral Network Approach to The Detection of Incipient Faults on Power Distribution Feeders", 8047c IEEE Transactions on Power Delivery 5 (Apr. 1990), No. 2, New York, US, XP 000127842, pp. 905-914.

* cited by examiner

COMPUTER-IMPLEMENTED METHOD OF POWER LINE PROTECTION, INTELLIGENT ELECTRONIC DEVICE AND ELECTRIC POWER SYSTEM

CROSS-REFERENCE TO RELATED APPLICATIONS

The present application is a national stage entry of International Application No. PCT/EP2022/060654, filed on Apr. 22, 2022, which claims priority to Indian Application No. 202141018766, filed on Apr. 23, 2021, and European Application No. 21179002.7, filed on Jun. 11, 2021, which are all hereby incorporated herein by reference as if set forth in full.

FIELD OF THE INVENTION

The invention relates to power transmission systems and devices and methods for protecting power transmission lines. The invention relates in particular to methods and devices that are operative to perform at least one of fault classification, zone classification, and/or distance protection.

BACKGROUND OF THE INVENTION

Electric power grids are undergoing a significant change in generation mix, from synchronous AC rotating machines to Inverter-Based Resource (IBR) technologies. A consequence of this trend is more deployment of renewables both at transmission and distribution networks. In addition to environmental benefits, introduction of renewable energy sources changes the operation of power systems: e.g. reduced inertia, less stability margins, and increased unpredictability. Since most of these renewable technologies are inverter interfaced, their behavior under fault conditions is different than conventional rotating machines. This creates new challenges in power system protection. One issue with higher penetration of inverter-based resources such as wind and solar photovoltaic (PV) generation is a reduction in fault current levels and short circuit strength of the power grid.

Moreover, the power system stability margin depends on the inertia of the system and it determines the desired speed of the protection scheme. IBR systems often have low inertia and hence lesser stability margins. A reduced stability margin implies lower critical clearing time. Faults must be cleared faster than the critical clearing time or otherwise system may lose transient stability and it leads to power system blackout.

A distance relay is a protective device that is designed to provide primary and backup protection of transmission lines. Conventional distance relays are not self-adjusting as and when the system changes. Routine manual adjustments and automated adaptivity may be afforded to some extent in protective relaying.

WO 2005/076428 A9 discloses a system and method for detecting high impedance faults (HIF) in electrical power lines using Artificial Neural Network (ANN). The method is wavelet transform based and hence can be computationally intensive for practical applications. A detection rate of 70.83% with a 22.06% false alarm rate may not be a satisfactory performance for a protection application. The use of a spectrum of a 3-cycle window of data may not be desirable for protection application.

U.S. Pat. No. 7,720,619 B2 discloses a method for detecting high impedance faults. Artificial intelligence (AI) methods of classification and pattern recognition, such as neural networks, expert systems or decision trees may be used to differentiate a HIF condition from other system conditions, such as switching operations and noisy loads.

U.S. Pat. No. 6,405,184 B1 discloses a method for generating fault classification signals which identify faulty loops in the event of a fault. A neural network is used which is trained using input variables simulating faulty loops. Measured values from currents and voltages of loops of the energy supply system are derived and fault classification signals are generated by the trained model in the event of a fault.

WO 1995/009465 A1 discloses a method for generating a direction signal which indicates the direction of a short-circuit current. The direction signal indicates whether a short circuit occurred in forward direction from the measuring point. A neural network is used for generating the direction signal which is formed using normalized sampling values of the currents.

An artificial neural network (ANN) based approach for three-zone distance protection of transmission lines is presented in A. Feilat and K. Al-Tallaq, "A new approach for distance protection using artificial neural network," $39^{th}$ International Universities Power Engineering Conference, 2004. UPEC 2004, Bristol, U K, 2004, pp. 473-477 Vol. 1. The technique handles only fault detection and classification aspects of distance protection. The input features of the neural network are the fundamental frequency voltage and current magnitudes extracted by Discrete Fourier Transform. Hence, the solution is not expected to improve the speed of the existing phasor-based distance protection algorithms.

J. R. de Carvalho et al., "Development of detection and classification stages for a new distance protection approach based on cumulants and neural networks," 2011 IEEE Power and Energy Society General Meeting, Detroit, MI, USA, 2011, pp. 1-7 suggests the use of Artificial Intelligence (AI) for distance relaying. Fault detection and classification functions can be implemented.

S. R. Samantaray et al., "Transmission line distance relaying using machine intelligence technique," IET Generation, Transmission & Distribution, vol. 2, no. 1, pp. 53-61, January 2008 describes an approach for distance relaying of transmission line using machine intelligence technique such as support vector machine (SVM). Post-fault current and voltage samples are used as inputs to SVM. The total time taken for faulty phase selection and ground detection is 10 ms (half cycle) from the inception of fault.

A Neural Network based impedance protection for power transmission lines to eliminate the undesired effect of fault resistance on traditional distance relay operation is presented in P. Vaidya and P. A. Venikar, "ANN based distance protection of long transmission lines by considering the effect of fault resistance," IEEE-International Conference On Advances In Engineering, Science And Management (ICAESM-2012), Nagapattinam, Tamil Nadu, 2012, pp. 590-594, 2012. The algorithm uses resistance as well as reactance magnitudes as inputs. However, the pre-processing which is done to decrease the neural network size includes DFT to compute the fundamental frequency components. Hence, the speed of phasor-based distance protection algorithms is not enhanced significantly.

F. Rafique et al., "An accurate digital distance protection scheme using neural network in UHV transmission line," Proceedings of 2014 IEEE Chinese Guidance, Navigation and Control Conference, Yantai, pp. 1949-1954, 2014 discloses an impedance relaying system combined with ANN block which uses zero sequence component of a fault current. The Fast Fourier Transform (FFT) to extract fundamental components introduces limitations with respect to speed. Also, use of zero sequence components introduces further limitations when the fault is a symmetrical fault or not involving ground, and zero sequence quantities are absent.

M. Oleskovicz et al., "A complete scheme for fault detection, classification and location in transmission lines using neural networks," in Proceedings of the IEEE 7th International Conference on Developments in Power System Protection (DSP '01), pp. 335-338, 2001 presents an ANN approach for a complete scheme of distance protection. The inputs for the presented solution are three-phase voltages and currents samples in pre-fault and during-fault conditions. However, the average response time is 13 ms with 98% accuracy.

There is a continued need for improvement of techniques for transmission line protection.

SUMMARY

The addition of inverter-based resources (IBR) to power grids provides challenges to transmission line protection. Fault currents produced by IBR are often low in magnitude and do often not contain adequate levels or no negative quantities for application of conventional protection schemes. Lack of these negative quantities may result in incorrect phase and zone classification for line distance intelligent electronic devices (IEDs). Lower fault current magnitudes can influence distance relay performance, which can cause mis-operation or non-operation of distance protection elements. Techniques that mitigate these challenges by human-expert based relay settings may not be able eliminate the protection issues completely.

There is a need for improved techniques of power system protection. There is a need for improved techniques adapted for power line protection. There is also a need for a method, device, and system that is capable of providing a protection function (e.g., an autonomous distance protection method) which can protect systems having IBRs efficiently. There is in particular a need for such a method, device, and system in which phase classification, zone classification, and/or a protection function can be generated using a data-driven approach. There is also a need for such a method, device, and system in which phase classification, zone classification, and/or a protection function can be determined in a self-setting manner. There is in particular a need for such a method, device, and system that provides a fast and secure fault and zone classification for power systems having IBRs.

A method, device, and system according to embodiments may be operative to provide an artificial intelligence (AI)/machine learning (ML)-based implementation of a function for power system protection and/or monitoring. The method, device, and system according to embodiments may be operative to provide an AI/ML-based phase identification (for fault classification) and zone identification for transmission line systems. The method, device, and system are particularly suitable for power systems with a high penetration of the IBRs.

A method, device, and system according to embodiments may be operative to perform a fault inception time detection using an analytics approach. The method, device, and system may be operative to determine a sliding window moving average and a sliding window standard deviation of at least one power system characteristics (such as currents and/or voltages) and to compare a modulus of a deviation from the sliding window moving average to a threshold that depends on the sliding window standard deviation, in order to thereby determine the fault inception time.

The sliding window moving average may be an average of the at least one power system characteristics (e.g., voltage and/or current or several voltages and/or currents) in the sliding window.

The sliding window standard deviation may be a standard deviation of the at least one power system characteristics (e.g., voltage and/or current or several voltages and/or currents) in the sliding window.

A method, device, and system according to embodiments may be operative to perform a smart training window selection to improve accuracy. The method, device, and system may be operative to determine a rate of change of currents and/or voltages based on a number of samples per cycle that is used for a moving average filter.

A method, device, and system according to embodiments provides a system independent feature selection for training and building artificial intelligence (AI)/machine learning (ML) model.

A method, device, and system according to embodiments is may be to generate and/or use interpretable code from the trained AI/ML model for implementation in IEDs.

A method, device, and system according to embodiments may be operative to continually update the phase classification, zone classification, and/or protection function during field operation of the transmission system.

A method, device, and system according to embodiments may be operative to provide power line protection for power systems with high penetration of inverter-based (Renewables) resources. A machine learning model obtained in the method is independent of system parameters. It can be applied to any system without the need for additional training.

For a method, device, and system according to embodiments, features that are used as inputs in AI/ML model training and/or that are used as inputs for a trained classifier or protection function may be specifically chosen. Namely, features that are indicative of rates of change of the voltages for three phases and that are indicative of rates of change of currents for the three phases of a transmission line may be used as inputs. This may apply both during training, where a random forest (RF) training or other AI/ML model training may be performed, and during use of the created decision logic.

An input layer of the AI/ML model may receive rate of change values indicative of a rate of change of one or several power system characteristics (such as rates of change of voltages and/or currents).

An output layer of the AI/ML model may provide a signal indicative a fault and/or a type of fault and/or zone of fault.

In a method, device, and system according to embodiments, a first random forest having a first plurality of decision trees may be generated to operate as phase classifier that receives rate of change values of voltages at three phases and rate of change values of currents at the three phases as inputs, performs a fault classification, and outputs information on the fault type. The phase classifier may be operative to classify, responsive to receipt of rate of change values of voltages at three phases and rate of change values of currents at the three phases as inputs, the fault into one of the types ABC, A-g, BC, CA-g.

In a method, device, and system according to embodiments, a second random forest having a second plurality of decision trees may be generated to operate as zone classifier that receives rate of change values of voltages at three phases and rate of change values of currents at the three phases as inputs, performs a zone classification, and outputs information on the zone type. The zone classifier may be operative to classify, responsive to receipt of rate of change values of voltages at three phases and rate of change values of currents at the three phases as inputs, the fault into one of a plurality of discrete zones (such as zone 1, zone 2).

A computer-implemented method according to an embodiment comprises computing features for use in generating a decision logic operative to generate a signal operative for use with a power system, wherein computing the features comprises: determining a fault inception time from at least one electric characteristics of data sampled for a given type of power system; determining rate of change values indicative of a rate of change of the at least one electric characteristics for at least one sample time, the at least one sample time being dependent on the fault inception time; and using the features to generate the decision logic.

The method may further comprise deploying the decision logic to an intelligent electronic device (IED) to generate the signal.

The method may further comprise executing, by an intelligent electronic device (IED), the decision logic to generate the signal.

The method may be a method for power system protection and/or monitoring.

The decision logic may be a protection logic.

The decision logic may be or may implement a distance protection function.

The given type of power system may be a transmission line.

The decision logic may be deployed for protecting and/or monitoring a plurality of electric power systems of the given type.

The plurality of electric power systems of the given type may be a plurality of transmission lines.

The plurality of transmission lines may comprise transmission lines distinguished from each other in installation location.

The plurality of transmission lines may comprise transmission lines distinguished from each other in line length.

The plurality of transmission lines may comprise transmission lines distinguished from each other in conductor diameter.

The method may be a method for transmission line protection.

The decision logic may be or may comprise at least one of: a protection function; a phase classifier for fault classification; a zone classifier for faulted zone identification.

The signal may be or may comprise at least one of: a circuit breaker control signal; a switch control signal; an alarm; a warning; status information; output for outputting via a human machine interface (HMI).

Determining the fault inception time may comprise determining a sliding window moving average and a sliding window standard deviation of the at least one electric characteristic and comparing a modulus of a deviation of the at least one electric characteristic from the sliding window moving average to at least one threshold.

The at least one threshold may depend on the sliding window standard deviation.

The fault inception time may be identified as earlier one of a time at which a modulus of a deviation of a voltage from a sliding window moving average of the voltage reaches or exceeds a phase-specific voltage threshold and a time at which a modulus of a deviation of a current from a sliding window moving average of the current reaches or exceeds a phase-specific current threshold.

Determining the rate of change values may comprise, for each phase, determining a filtered voltage, determining a filtered current, and calculating the rate of change values from the filtered voltage and from the filtered current.

The filtered voltage may be determined by averaging a number N>1 of sample values of the voltage and the filtered current is determined by averaging a number N>1 of sample values of the current.

Calculating the rate of change values may comprises determining a voltage difference between a sample value of the filtered voltage at a time k and a sample value of the filtered voltage at a time k–N, and a current difference between a sample value of the filtered current at a time k and a sample value of the filtered current at a time k–N.

The rate of change values for the voltage may be determined as a change of the voltage difference between a sample time and a previous sample time.

The rate of change values for the current may be determined as a change of the current difference between the sample time and the previous sample time.

Deploying the decision logic may comprise deploying a phase classifier and/or a zone classifier for execution by the IED for distance protection.

Generating the decision logic may comprise using the features to generate one or both of a phase classifier and a zone classifier.

Using the features to generate the decision logic may comprises generating the phase classifier and generating the zone classifier using an ensemble machine learning (ML) method.

Generating the phase classifier and generating the zone classifier may comprise a random forest training using the features to generate a random forest.

Features for nodes of an input layer of decision trees of the random forest may be selected from the rate of change values.

The features for nodes of an input layer of decision trees of the random forest may be selected from at least m×n rate of change values indicative of the rate of change of the voltage and m×n rate of change values indicative of the rate of change of the current, where m≥2 indicates a number of phases and n≥1 indicates a number of sample times.

The features for nodes of an input layer of decision trees of the random forest may be selected from at least m×n rate of change values indicative of the rate of change of the voltage and m×n rate of change values indicative of the rate of change of the current, where m≥2 indicates a number of phases and n≥2 indicates a number of sample times that depend on the fault inception time.

The features for nodes of an input layer of decision trees of the random forest may be selected from at least m×n rate of change values indicative of the rate of change of the voltage and m×n rate of change values indicative of the rate of change of the current, where m=3 indicates a number of phases and n≥2 indicates a number of sample times that depend on the fault inception time.

The features for nodes of an input layer of decision trees of the random forest may be selected from samples times that are taken from up to a quarter cycle after the fault inception time.

The features for nodes of an input layer of decision trees of the random forest may be selected from samples times that are not taken from times after a quarter cycle after the fault inception time.

Using the rate of change values to generate one or both of the phase classifier and the zone classifier may comprise training a first machine learning model, using the features, to generate the phase classifier.

Using the rate of change values to generate one or both of the phase classifier and the zone classifier may comprise training a second machine learning model, using the features, to generate the zone classifier.

The phase classifier may receive rates of change of voltages for three phases and rates of change of currents for the three phases as inputs and may output a fault type.

The zone classifier receives may receive rates of change of voltages for three phases and rates of change of currents for the three phases as inputs and may output a zone.

The phase classifier and/or zone classifier may be generated in a self-setting manner.

The decision logic may be a decision logic for transmission line protection.

The transmission line protection may comprise a high impedance fault protection.

Generating the phase classifier and/or zone classifier may be performed using a dataset including data for several distinct source to line impedances.

A computing system according to an embodiment has an interface or memory operative to receive or store training data indicative electric power system characteristics (such as voltages and/or currents of faulted lines). The computing system has at least one integrated circuit operative to compute features for use in generating a decision logic for power system protection and/or compute features for use in generating a decision logic operative to generate a signal operative for use with a power system, wherein computing the features comprises: determining a fault inception time from at least one electric characteristics of data sampled for a given type of power system; determining rate of change values indicative of a rate of change of the at least one electric characteristics for at least one sample time, the at least one sample time being dependent on the fault inception time. The at least one integrated circuit is operative to use the features to generate the decision logic.

The computing system may have an output interface to deploy the decision logic to an intelligent electronic device (IED) to generate the signal.

The computing system may comprise an intelligent electronic device (IED) operative to execute the decision logic to generate the signal.

The computing system may be a computing system for power system protection and/or monitoring.

The decision logic may be a protection logic.

The decision logic may be or may implement a distance protection function.

The given type of power system may be a transmission line.

The computing system may be operative to deploy the decision logic for protecting and/or monitoring a plurality of electric power systems of the given type.

The plurality of electric power systems of the given type may be a plurality of transmission lines.

The plurality of transmission lines may comprise transmission lines distinguished from each other in installation location.

The plurality of transmission lines may comprise transmission lines distinguished from each other in line length.

The plurality of transmission lines may comprise transmission lines distinguished from each other in conductor diameter.

The computing system may be operative to generate a decision logic for transmission line protection.

The computing system may be operative to generate a decision logic that may be or may comprise at least one of:

a protection function; a phase classifier for fault classification; a zone classifier for faulted zone identification.

The signal may be or may comprise at least one of: a circuit breaker control signal; a switch control signal; an alarm; a warning; status information; output for outputting via a human machine interface (HMI).

The computing system may be operative such that determining the fault inception time may comprise determining a sliding window moving average and a sliding window standard deviation of the at least one electric characteristic and comparing a modulus of a deviation of the at least one electric characteristic from the sliding window moving average to at least one threshold.

The computing system may be operative such that the at least one threshold may depend on the sliding window standard deviation.

The computing system may be operative such that the fault inception time may be identified as earlier one of a time at which a modulus of a deviation of a voltage from a sliding window moving average of the voltage reaches or exceeds a phase-specific voltage threshold and a time at which a modulus of a deviation of a current from a sliding window moving average of the current reaches or exceeds a phase-specific current threshold.

The computing system may be operative such that determining the rate of change values may comprise, for each phase, determining a filtered voltage, determining a filtered current, and calculating the rate of change values from the filtered voltage and from the filtered current.

The computing system may be operative such that the filtered voltage may be determined by averaging a number N>1 of sample values of the voltage and the filtered current is determined by averaging a number N>1 of sample values of the current.

The computing system may be operative such that calculating the rate of change values may comprises determining a voltage difference between a sample value of the filtered voltage at a time k and a sample value of the filtered voltage at a time k–N, and a current difference between a sample value of the filtered current at a time k and a sample value of the filtered current at a time k–N.

The computing system may be operative such that the rate of change values for the voltage may be determined as a change of the voltage difference between a sample time and a previous sample time.

The computing system may be operative such that the rate of change values for the current may be determined as a change of the current difference between the sample time and the previous sample time.

The computing system may be operative to deploy the decision logic for execution by an intelligent electronic device (IED).

The computing system may be operative such that deploying the decision logic may comprise deploying a phase classifier and/or a zone classifier for execution by the IED for distance protection.

The computing system may be operative such that generating the decision logic may comprise using the features to generate one or both of a phase classifier and a zone classifier.

The computing system may be operative such that using the features to generate the decision logic may comprises generating the phase classifier and generating the zone classifier using an ensemble machine learning (ML) method.

The computing system may be operative such that generating the phase classifier and generating the zone classifier may comprise a random forest training using the features to generate a random forest.

The computing system may be operative such that features for input nodes of decision trees of the random forest may be selected from the rate of change values.

The computing system may be operative such that the features for input nodes of decision trees of the random forest may be selected from at least m×n rate of change values indicative of the rate of change of the voltage and m×n rate of change values indicative of the rate of change of the current, where m≥2 indicates a number of phases and n≥1 indicates a number of sample times.

The computing system may be operative such that the features for input nodes of decision trees of the random forest may be selected from at least m×n rate of change values indicative of the rate of change of the voltage and m×n rate of change values indicative of the rate of change of the current, where m≥2 indicates a number of phases and n≥2 indicates a number of sample times that depend on the fault inception time.

The computing system may be operative such that the features for input nodes of decision trees of the random forest may be selected from at least m×n rate of change values indicative of the rate of change of the voltage and m×n rate of change values indicative of the rate of change of the current, where m=3 indicates a number of phases and n≥2 indicates a number of sample times that depend on the fault inception time.

The computing system may be operative such that the features for input nodes of decision trees of the random forest may be selected from samples times that are taken from up to a quarter cycle after the fault inception time.

The computing system may be operative such that the features for input nodes of decision trees of the random forest may be selected from samples times that are not taken from times after a quarter cycle after the fault inception time.

The computing system may be operative such that using the rate of change values to generate one or both of the phase classifier and the zone classifier may comprise training a first machine learning model, using the features, to generate the phase classifier.

The computing system may be operative such that using the rate of change values to generate one or both of the phase classifier and the zone classifier may comprise training a second machine learning model, using the features, to generate the zone classifier.

The computing system may be operative such that the phase classifier may receive rates of change of voltages for three phases and rates of change of currents for the three phases as inputs and may output a fault type.

The computing system may be operative such that the zone classifier receives may receive rates of change of voltages for three phases and rates of change of currents for the three phases as inputs and may output a zone.

The computing system may be operative to generate the phase classifier and/or zone classifier in a self-setting manner.

The computing system may be operative such that the decision logic may be a decision logic for transmission line protection.

The computing system may be operative such that the transmission line protection may comprise a high impedance fault protection.

The computing system may be operative such that generating the phase classifier and/or zone classifier may be performed using a dataset including data for several distinct source to line impedances.

According to embodiments that may be used in combination or independently of the above-described embodiments, a method for power system protection, in particular transmission line protection, comprises determining a fault inception time from a voltage and/or current. The method comprises determining rate of change values indicative of a rate of change of the voltage and/or of a rate of change of the current for at least one sample time, the at least one sample time being dependent on the fault inception time. The method comprises using the rate of change values to generate a protection function (such as a protection logic), a phase classifier for fault classification and/or a zone classifier for faulted zone identification.

The method may be a computer-implemented method.

The method may be performed automatically by at least one integrated circuit.

The at least one integrated circuit may be at least one integrated circuit of a computing device. The at least one integrated circuit may be at least one integrated circuit of an intelligent electronic device (IED).

The method may further comprise deploying the phase classifier and/or the zone classifier for execution by an intelligent electronic device, IED, for distance protection.

The method may further comprise generating an intelligent electronic device, IED, decision logic based on the phase classifier and the zone classifier and deploying the IED decision logic for execution.

The IED decision logic may be a decision tree.

The IED decision logic may be an interpretable IED decision logic.

The IED may be a distance relay.

Generating the phase classifier and generating the zone classifier may comprise an ensemble machine learning method.

The method may comprise deriving features for training the machine learning model from training data comprising voltages and currents.

Deriving the features may comprise determining rates of change of voltages of plural phases of a transmission line and rates of change of currents of the plural phases of the transmission line at one or several times that depend on a fault inception time.

Generating the phase classifier and generating the zone classifier may comprise a random forest training to generate a random forest.

Features for nodes of an input layer of decision trees of the random forest may be selected from the rate of change values.

The features for nodes of an input layer of decision trees of the random forest may be selected from at least m×n rate of change values indicative of the rate of change of the voltage and m×n rate of change values indicative of the rate of change of the current, where m≥2 indicates a number of phases and n≥1 indicates a number of sample times.

The features for nodes of an input layer of decision trees of the random forest may be selected from at least m×n rate of change values indicative of the rate of change of the voltage and m×n rate of change values indicative of the rate of change of the current, where m≥2 indicates a number of phases and n≥2 indicates a number of sample times that depend on the fault inception time.

The features for nodes of an input layer of decision trees of the random forest may be selected from at least m×n rate of change values indicative of the rate of change of the voltage and m×n rate of change values indicative of the rate of change of the current, where m=3 indicates a number of phases and n≥2 indicates a number of sample times that depend on the fault inception time.

The features for nodes of an input layer of decision trees of the random forest may be selected from samples times that are taken from up to a quarter cycle after the fault inception time.

The features for nodes of an input layer of decision trees of the random forest may be selected from samples times that are not taken from times after a quarter cycle after the fault inception time.

The random forest training may be performed using datasets of L>1 faulted lines each including the voltages and currents for three phases.

Using the rate of change values to generate the phase classifier and/or the zone classifier may comprise training a first machine learning model to generate the phase classifier, and training a second machine learning model to generate the zone classifier.

The first machine learning model may comprise a first random forest having a first plurality of decision trees and the second machine learning model comprises a second random forest having a second plurality of decision trees different from the first plurality of decision tress.

A number of the second plurality of decision trees may exceed a number of the first plurality of decision trees.

A first number of variables available for splitting at each tree node in the first random forest is greater than a second number of variables available for splitting at each tree node in the second random forest.

The first machine learning model may be a first random forest classifier and the second machine learning model may be a second random forest classifier.

Determining the fault inception time may comprise determining a sliding window moving average and a sliding window standard deviation.

Determining the fault inception time may comprise comparing a modulus of a deviation from the sliding window moving average to a threshold.

The threshold may depend on the sliding window standard deviation.

Determining the fault inception time may comprise performing, for each phase, respectively a comparison of a modulus of a deviation of the voltage from the sliding window moving average of the voltage to a phase-specific voltage threshold that depends on the sliding window standard deviation of the voltage for the phase, and a comparison of a modulus of a deviation of the current from the sliding window moving average of the current to a phase-specific current threshold that depends on the sliding window standard deviation of the current for the phase. The earliest time in which the threshold is reached for any phase and for either voltage or current may be determined to be the fault inception time.

Determining the rate of change values may comprise, for each phase, determining a filtered voltage, determining a filtered current, and calculating the rate of change values from the filtered voltage and from the filtered current.

Filtering may comprise applying a moving average filter.

The phase classifier may receive rates of change of voltages for three phases and rate of change of currents for the three phases as inputs and may output a fault type.

The fault type may be selected from a group consisting of ABC, A-g, BC, CA-g.

The zone classifier may receive rates of change of voltages for three phases and rates of change of currents for the three phases as inputs and may output a zone.

The zone may be selected from two zones or more than two zones.

The method may comprise updating the phase classifier, the zone classifier, and/or the protection function during field operation of an IED.

The method may comprise re-training a machine learning model during field operation of the IED.

Re-training the machine learning model may comprise re-training a random forest.

The method may be used to generate a phase classifier, zone classifier, protection function, or other decision logic, in particular for distance protection, for a transmission line of a power system having IBRs.

The phase classifier and/or zone classifier may be determined in a self-setting manner, providing autonomous generation of a decision logic.

The transmission line protection may comprise a high impedance fault protection.

Generating the phase classifier and/or zone classifier may be performed using a dataset including data for several distinct source to line impedances.

A computing system according to an embodiment has an interface or memory operative to receive or store training data indicative of voltages and/or currents of faulted lines. The computing system has at least one integrated circuit operative to determine a fault inception time from the voltages and/or currents of the faulted lines, determine rate of change values indicative of a rate of change of the voltages and/or indicative of a rate of change of the currents for at least one sample time that is dependent on the fault inception time, and use the rate of change values to generate, using machine learning, a decision logic.

The decision logic may be at least one of the distance protection function, the phase classifier for fault classification, and/or the zone classifier for faulted zone identification.

The computing system may be an intelligent electronic device, IED, for distance protection.

The computing system may have an interface for deploying the phase classifier, zone classifier, or a decision logic derived therefrom (such as a protection function decision logic) to an intelligent electronic device, IED, for distance protection.

The computing system may be operative for generating an intelligent electronic device, IED, decision logic based on the phase classifier and the zone classifier and deploying the IED decision logic for execution.

The IED decision logic may be a decision tree.

The IED decision logic may be an interpretable IED decision logic.

The IED may be a distance relay.

The computing system may be operative such that generating the phase classifier and generating the zone classifier comprises an ensemble machine learning method.

The computing system may be operative to derive features for training the machine learning model from training data comprising voltages and currents.

The computing system may be operative such that deriving the features may comprise determining rates of change of voltages of plural phases of a transmission line and rates of change of currents of the plural phases of the transmission line at one or several times that depend on a fault inception time.

The computing system may be operative such that generating the phase classifier and generating the zone classifier may comprise a random forest training to generate a random forest.

The computing system may be operative such that features for nodes of an input layer of decision trees of the random forest may be selected from the rate of change values.

The computing system may be operative such that the features for nodes of an input layer of decision trees of the random forest may be selected from at least m×n rate of change values indicative of the rate of change of the voltage and m×n rate of change values indicative of the rate of change of the current, where m≥2 indicates a number of phases and n≥1 indicates a number of sample times.

The computing system may be operative such that the features for nodes of an input layer of decision trees of the random forest may be selected from at least m×n rate of change values indicative of the rate of change of the voltage and m×n rate of change values indicative of the rate of change of the current, where m≥2 indicates a number of phases and n≥2 indicates a number of sample times that depend on the fault inception time.

The computing system may be operative such that the features for nodes of an input layer of decision trees of the random forest may be selected from at least m×n rate of change values indicative of the rate of change of the voltage and m×n rate of change values indicative of the rate of change of the current, where m=3 indicates a number of phases and n≥2 indicates a number of sample times that depend on the fault inception time.

The features for nodes of an input layer of decision trees of the random forest may be selected from samples times that are taken from up to a quarter cycle after the fault inception time.

The features for nodes of an input layer of decision trees of the random forest may be selected from samples times that are not taken from times after a quarter cycle after the fault inception time.

The computing system may be operative such that the random forest training is performed using datasets of L>1 faulted lines each including the voltages and currents for three phases.

The computing system may be operative for training a first machine learning model to generate the phase classifier, and training a second machine learning model to generate the zone classifier.

The computing system may be operative such that the first machine learning model comprises a first random forest having a first plurality of decision trees and the second machine learning model comprises a second random forest having a second plurality of decision trees different from the first plurality of decision tress.

The computing system may be operative such that the first machine learning model may be a first random forest classifier and the second machine learning model may be a second random forest classifier.

The computing system may be operative such that determining the fault inception time comprises determining a sliding window moving average and a sliding window standard deviation.

The computing system may be operative such that determining the fault inception time comprises comparing a modulus of a deviation from the sliding window moving average to a threshold.

The computing system may be operative such that the threshold depends on the sliding window standard deviation.

The computing system may be operative such that determining the fault inception time comprises performing, for each phase, respectively a comparison of a modulus of a deviation of the voltage from the sliding window moving average of the voltage to a phase-specific voltage threshold that depends on the sliding window standard deviation of the voltage for the phase, and a comparison of a modulus of a deviation of the current from the sliding window moving average of the current to a phase-specific current threshold that depends on the sliding window standard deviation of the current for the phase. The earliest time in which the threshold is reached for any phase and for either voltage or current may be determined to be the fault inception time.

The computing system may be operative such that determining the rate of change values comprises, for each phase, determining a filtered voltage, determining a filter current, and calculating the rate of change values from the filtered voltage and from the filtered current.

The computing system may be operative such that the phase classifier receives rates of change of voltages for three phases and rate of change of currents for the three phases as inputs and may output a fault type.

The computing system may be operative such that the fault type is selected from a group consisting of ABC, A-g, BC, CA-g.

The computing system may be operative such that the zone classifier receives rates of change of voltages for three phases and rates of change of currents for the three phases as inputs and may output a zone.

The computing system may be operative such that the zone is selected from two zones or more than two zones.

The computing system may be operative to update the phase classifier, the zone classifier, and/or the protection function during field operation of an IED.

The computing system may be operative to re-train a machine learning model during field operation of the IED.

The computing system may be operative such that re-training the machine learning model comprises re-training a random forest.

An intelligent electronic device, IED, according to an embodiment comprises an interface to receive an electric power system characteristic, such as a voltage and/or current for at least one phase of a power transmission line. The IED may be operative to determine a rate of change of the power system characteristic (e.g., a rate of change of the voltage and/or a rate of change of the current) and to input the determined rate of change as input into a decision logic.

The electric power system may be or may comprise a transmission line.

The decision logic may be at least one of a distance protection function, a phase classifier for fault classification, a zone classifier for faulted zone identification.

The decision logic may be operative to receive rates of change of voltages for three phases and rates of change of currents for the three phases of the power transmission line as inputs.

The IED may be operative to determine a filtered voltage from the voltage, determine a filtered current from the current, calculate the rate of change of the voltage from the filtered voltage, and calculate the rate of change of the current from the filtered current.

The phase classifier may comprise or may be based on a first random forest.

The zone classifier may comprise or may be based on a second random forest.

The phase classifier may comprise or may be on a first random forest comprising a first plurality of decision trees, the zone classifier may comprise or may be based on a second random forest comprising a second plurality of trees.

A number of the second plurality of decision trees may exceed a number of the first plurality of decision trees.

A first number of variables available for splitting at each tree node in the first random forest is greater than a second number of variables available for splitting at each tree node in the second random forest.

The IED may be operative to update the phase classifier, the zone classifier, and/or the protection function during field operation of the IED.

The IED may be operative to re-train a machine learning model during field operation of the IED.

The IED may be operative such that re-training the machine learning model comprises re-training a random forest.

An electric power system comprises a power transmission line and the intelligent electronic device, IED, according to an embodiment operative to perform a distance protection function for the power transmission line.

The electric power system may further comprise one or several inverter-based resources.

The inverter-based resources may be renewable energy resources.

The electric power system may further comprise a computing system operative to receive training data indicative of voltages and/or currents of faulted lines, determine a fault inception time from the voltages and/or currents of the faulted lines, determine rate of change values indicative of a rate of change of the voltages and/or indicative of a rate of change of the currents for at least one sample time that is dependent on the fault inception time, and use the rate of change values to generate, using machine learning, a decision logic that is at least one of the distance protection function, the phase classifier for fault classification, and/or the zone classifier for faulted zone identification, and deploy the decision logic to the intelligent electronic device, IED.

According to embodiments that may be used in combination or independently of the above-described embodiments, a computer-implemented method for implementing a power system protection comprises:

generating a phase classifier,
generating a zone classifier
from labeled data sets.

The method may comprise generating the phase classifier and the zone classifier by performing random forest training.

Generating the phase classifier and generating the zone classifier may comprise training a machine learning (ML) model.

Generating the phase classifier and generating the zone classifier may comprise determining features from the labeled data sets for training a decision logic model. The decision logic model may comprise a ML model. The decision logic model may comprise first and second ML models.

Determining the features for training may comprise: determining a fault inception time from a voltage and/or current in the labeled data sets; determining rate of change values indicative of a rate of change of the voltage and/or of a rate of change of the current for at least one sample time, the at least one sample time being dependent on the fault inception time.

The method may comprise deploying at least one of:
the phase classifier,
the zone classifier, a protection function generated based on the phase classifier and/or the zone classifier to at least one intelligent electronic device (IED).

The method may comprise executing, by the IED, at least one of:
the phase classifier,
the zone classifier,
the protection function
in field use of the IED.

According to embodiments that may be used in combination or independently of the above-described embodiments, there is provided a use of at least one integrated circuit for generating features indicative of a rate of change of at least one electric characteristic of an electric power system, the features being input to an input layer of at least one machine learning (ML) or artificial intelligence (AI) model, the ML or AI model having an output layer that provides provide a signal indicative a fault and/or a type of fault and/or zone of fault.

The use may further comprise deploying the ML or AI model to an intelligent electronic device (IED) to generate the signal.

The use may further comprise executing, by an intelligent electronic device (IED), the ML or AI model to generate the signal.

The use may further comprise executing, by an intelligent electronic device (IED), the ML or AI model for power system protection and/or monitoring.

The ML or AI model may be a protection logic.

The ML or AI model may be or may implement a distance protection function.

The use may comprise using the ML or AI model for transmission line protection.

The ML or AI model may be or may comprise at least one of: a protection function; a phase classifier for fault classification; a zone classifier for faulted zone identification.

The signal may be or may comprise at least one of: a circuit breaker control signal; a switch control signal; an alarm; a warning; status information; output for outputting via a human machine interface (HMI).

The use may comprise determining a fault inception time from at least one electric characteristic.

Determining the fault inception time may comprise determining a sliding window moving average of the at least one electric characteristic and comparing a modulus of a deviation of the at least one electric characteristic from the sliding window moving average to at least one threshold.

Determining the fault inception time may comprise determining a sliding window standard deviation of the at least one electric characteristic.

The at least one threshold may depend on the sliding window standard deviation.

The fault inception time may be identified as earlier one of a time at which a modulus of a deviation of a voltage from a sliding window moving average of the voltage reaches or exceeds a phase-specific voltage threshold and a time at which a modulus of a deviation of a current from a sliding window moving average of the current reaches or exceeds a phase-specific current threshold.

Generating features indicative of a rate of change may comprise, for each phase, determining a filtered voltage, determining a filtered current, and calculating the rate of change values from the filtered voltage and from the filtered current.

The filtered voltage may be determined by averaging a number N>1 of sample values of the voltage and the filtered current is determined by averaging a number N>1 of sample values of the current.

Generating features indicative of a rate of change may comprise determining a voltage difference between a sample value of the filtered voltage at a time k and a sample value of the filtered voltage at a time k–N, and a current difference between a sample value of the filtered current at a time k and a sample value of the filtered current at a time k–N.

The rate of change values for the voltage may be determined as a change of the voltage difference between a sample time and a previous sample time.

The rate of change values for the current may be determined as a change of the current difference between the sample time and the previous sample time.

The use may comprise deploying the ML or AI model to implement a phase classifier and/or a zone classifier for execution by the IED for distance protection.

The use may comprise using the features to generate one or both of a phase classifier and a zone classifier.

The use may comprise using generating the phase classifier and generating the zone classifier using an ensemble machine learning (ML) method.

Generating the phase classifier and generating the zone classifier may comprise a random forest training using the features to generate a random forest.

Features for nodes of an input layer of decision trees of the random forest may be selected from the rate of change values.

The features for nodes of an input layer of decision trees of the random forest may be selected from at least m×n rate of change values indicative of the rate of change of the voltage and m×n rate of change values indicative of the rate of change of the current, where m≥2 indicates a number of phases and n≥1 indicates a number of sample times.

The features for nodes of an input layer of decision trees of the random forest may be selected from at least m×n rate of change values indicative of the rate of change of the voltage and m×n rate of change values indicative of the rate of change of the current, where m≥2 indicates a number of phases and n≥2 indicates a number of sample times that depend on the fault inception time.

The features for nodes of an input layer of decision trees of the random forest may be selected from at least m×n rate of change values indicative of the rate of change of the voltage and m×n rate of change values indicative of the rate of change of the current, where m=3 indicates a number of phases and n≥2 indicates a number of sample times that depend on the fault inception time.

The features for nodes of an input layer of decision trees of the random forest may be selected from samples times that are taken from up to a quarter cycle after the fault inception time.

The features for nodes of an input layer of decision trees of the random forest may be selected from samples times that are not taken from times after a quarter cycle after the fault inception time.

Using features indicative of a rate of change to generate one or both of the phase classifier and the zone classifier may comprise training a first machine learning model, using the features, to generate the phase classifier.

Using features indicative of a rate of change to generate one or both of the phase classifier and the zone classifier may comprise training a second machine learning model, using the features, to generate the zone classifier.

The phase classifier may receive rates of change of voltages for three phases and rates of change of currents for the three phases as inputs and may output a fault type.

The zone classifier receives may receive rates of change of voltages for three phases and rates of change of currents for the three phases as inputs and may output a zone.

The use may comprise generating the phase classifier and/or zone classifier in a self-setting manner.

The ML or AI model may be a decision logic for transmission line protection.

The transmission line protection may comprise a high impedance fault protection.

The ML or AI model may be trained to generate the phase classifier and/or zone classifier using a dataset including data for several distinct source to line impedances.

Various effects and advantages are attained by the device, system, and method according to embodiments.

The method, device, and system allow phase classification, zone classification, and/or a protection function to be generated using a data-driven approach. The method, device, and system allow phase classification, zone classification, and/or a protection function to be determined in a self-setting manner. The method, device, and system provides a fast and secure fault and zone classification for power systems having IBRs.

The method, device, and system provide a trained AI/ML model that is system independent and hence does not require system data every time.

The method, device, and system provide fast and secure operation of transmission line relays in systems with high penetration of the inverter-based resources (renewables).

The method, device, and system provide an AI/ML model that can be interpreted. For illustration, the trained AI/ML model may be or may be transformable into a decision tree that is interpretable by a human expert.

The method, device, and system provide techniques for generating practically deployable code for easy import of the protection logic onto IEDs The devices, methods, and systems according to embodiments can be used in association with an IBR system, without being limited thereto. The devices, methods, and systems may be used to improve a distance protection function performed by a distance relay, without being limited thereto.

BRIEF DESCRIPTION OF THE DRAWINGS

The subject-matter of the invention will be explained in more detail with reference to preferred exemplary embodiments which are illustrated in the attached drawings, in which.

DETAILED DESCRIPTION OF EMBODIMENTS

Figure 1:
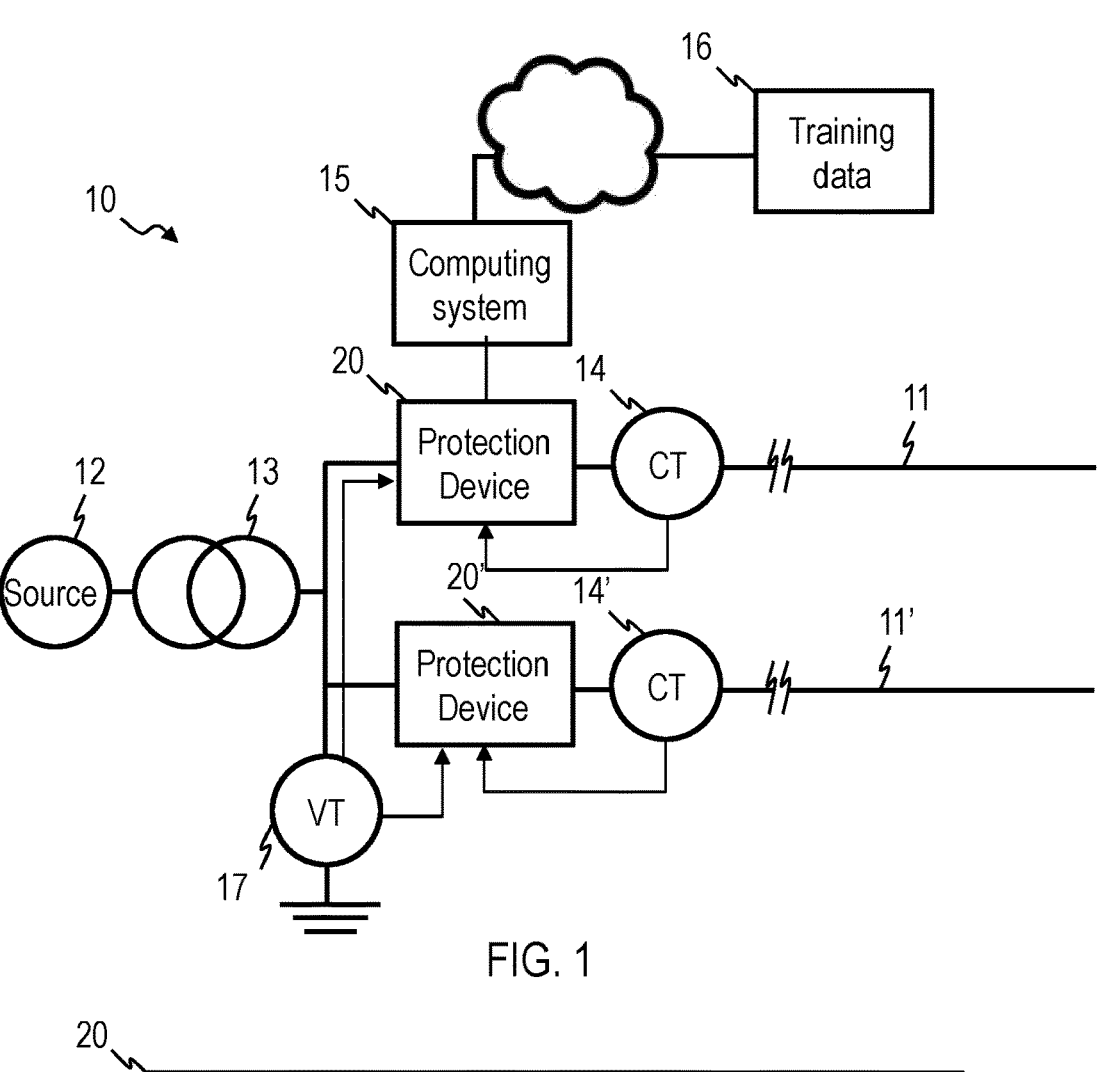
FIG. 1 is a schematic partial representation of a system comprising double-circuit lines and a protection device.

Exemplary embodiments of the invention will be described with reference to the drawings in which identical or similar reference signs designate identical or similar elements. While some embodiments will be described in the context of, the methods and devices described in detail below may be used in a wide variety of systems.

The features of embodiments may be combined with each other, unless specifically noted otherwise.

According to embodiments of the invention, methods, devices and systems are provided that are operative to perform a protection function, in particular a distance protection function, for an electric power system. The methods, devices and systems may be used for distance protection of transmission lines of electric power systems having inverter-based resources, such as renewables.

According to embodiments of the invention, devices, systems, and methods are provided that are operative to generate and/or use a phase classifier and a zone classifier for distance protection. The devices, systems, and methods may determine features from voltages and currents of three phases of a transmission line, with the features being indicative of rates of change of the voltages and rates of change of the currents. The features may be used for training one or several machine learning models to generate classifiers (training) and/or for using a decision logic that is based on the generated classifiers (live operation of an intelligent electronic device (IED)).

In certain embodiments, random forests may be generated using features derived from training data. The features may be indicative of rates of change of voltages and rates of change of currents of three phases of a faulted transmission line (with the training data encompassing voltages and currents prior to and subsequent to occurrence of the fault). The random forests may be trained to generate first random forest of first decision trees that implements a phase classifier indicating a type of fault and to generate a second random forest of second decision trees that implements a zone classifier indicating a faulted zone. Other machine learning (ML)/artificial intelligence (AI) models may be trained using features that are indicative of rates of change of voltages and rates of change of currents of three phases of a faulted transmission line.

As used herein, the term "phase classifier" refers to a classifier that outputs a fault type classification. For a three phase transmission line, the phase classifier may classify into classes selected from the group consisting of the types ABC, A-g, BC, CA-g.

As used herein, the term "zone classifier" refers to a classifier that outputs a zone. For illustration, the zone classifier may classify into classes selected from the group consisting of two zones (zone 1, zone 2), without being limited thereto.

In a method, device, and system according to embodiments, a second random forest having a second plurality of decision trees may be generated to operate as zone classifier that receives rate of change values of voltages at three phases and rate of change values of currents at the three phases as inputs, performs a zone classification, and outputs information on the zone type. The zone classifier may be operative to classify, responsive to receipt of rate of change values of voltages at three phases and rate of change values of currents at the three phases as inputs, the fault into one of a plurality of discrete zones (such as zone 1, zone 2).

FIG. 1 is a schematic partial representation of an electric power system 10. The electric power system 10 has source (s) 12 comprising inverter-based resources, such as renewable energy resources.

The electric power system has a transmission line 11. The source(s) 12 may be coupled to a transmission line 11 by transformer(s) 13. The electric power system may include a double-circuit transmission line 11, 11'.

A protection device 20 may be implemented as a protection relay, in particular a distance relay. The protection device 20 may receive currents for the transmission line from a current transformer 14. The protection device 20 may receive voltage measurements for the transmission line, such as phase-to-ground voltage at a terminal of the transmission line (e.g., a local bus) at which the protection device 20 is provided. The voltage may be received from a voltage transformer 17.

The protection device 20 may be operative to perform a distance protection function. The protection device 20 may execute a decision logic, such as a distance protection function, that uses rates of change of currents and rates of change of voltages of several phases of the transmission line 11 as inputs. The decision logic may include a phase classification, a zone classification, or a protection function that outputs a decision on whether or not tripping is to be performed.

For protection of a double-circuit transmission line 11, 11', a further protection device 20' may be provided that receives current and voltage measurements from a further current transformer 14' and from the voltage transformer 17 (or a dedicated further voltage transformer). The operation, construction, and function of the further protection device 20' may correspond to those of the protection device 20. Thus, reference will be made to protection device 20 in the following, it being understood that the techniques disclosed herein may be applied for generating a decision-making logic for each of several protection devices (i.e., the protection devices deployed on local and remote ends of a double-circuit transmission line) and/or during operation of the protection devices.

A decision logic executed by the protection device 20 may be determined by a computing system 15. The computing system 15 may, but does not need to be distinct and separate from the protection device 20.

The computing system 15 may be operative to receive training data 16 from a data repository and process the training data 16 to generate a phase classifier and a zone classifier. The phase and zone classifiers or a decision logic dependent thereon may be deployed to the protection device 20 for use in performing transmission line protection.

The training data 16 may encompass scenarios for various fault types, fault locations, source to line impedance ratios at terminals A and B, fault resistances, and inception angles.

The computing system 15 may be operative to provide an artificial intelligence (AI)/machine teaming (ML)-based phase identification (for fault classification) and zone identification for transmission line systems. The computing system 15 may be operative to perform a fault inception time detection in the training data 16 using an analytics approach. The computing system 15 may be operative to determine a sliding window moving average and a sliding window standard deviation of currents and/or voltages and to compare a modulus of a deviation from the sliding window moving average to a threshold that depends on the sliding window standard deviation, in order to thereby determine the fault inception time when generating the phase classifier and zone classifier. The computing system 15 may be operative to determine a rate of change of currents and a rate of change of voltages for three phases of transmission lines as represented by the training data 16, and to use these data for generating the phase classifier and the zone classifier.

The training data 16 may be or may include labeled training data that includes, in addition to currents and voltages for several phases of a transmission line, information on a fault type and/or information on a fault location. The information on the fault type and/or fault location may be used when performing ML training. Alternatively, the training data 16 may be or may include unlabeled training data. Expert knowledge may be used when processing the training data 16 to generate the phase classifier and zone classifier. Various ML techniques, such as random forests (RFs), have the capability of performing missing data replacement. Correlations between features are determined from the datasets and are used to compute substitute values for missing data, often in an iterative manner. Thus, even if only part of the training data includes a fault type and fault location in addition to currents and voltages, this may be sufficient to perform automatic classifier generation using a ML based approach.

The computing system 15 may be operative to determine, from training data associated with a transmission line, a fault inception time from voltages and/or currents of the phases. The computing system 15 may be operative to determine values indicative of a rate of change of the voltage and/or of a rate of change of the current. These values will be referred to as "rate of change values" for brevity, and typically include both rates of change of the voltages for several (in particular three) phases and rates of change of the currents for several (in particular three) phases of the transmission line. The rate of change values are taken at at least one time that depends on the determined fault inception time. The computing system 15 may be operative to use the rate of change values to generate a phase classifier for fault classification and/or a zone classifier for faulted zone identification. The computing system 15 may generate the phase classifier and the zone classifier using machine learning, in a data-driven and self-setting manner.

The rate of change values that are used for generating a decision logic may be selected from samples times that are taken from up to a quarter cycle after the fault inception time. The rate of change values that are used for generating a decision logic may be selected from samples times that are not taken from times after a quarter cycle after the fault inception time.

Based on the phase classifier and the zone classifier determined by the computing system 15, a decision logic for a protection function (in particular a distance protection function) may be determined. This may be done automatically by the computing system 15. Alternatively, the computing system 15 may aid an expert in setting up a decision logic by providing interpretable classifiers or decision logics for use in the protection device 20.

The phase classifier, zone classifier, or a protection function (in particular a distance protection function) generated therefrom may be loaded into the protection device 20 for execution. In field operation of the protection device 20, the protection device 20 may receive currents and voltages for the phases of the transmission line 11, may process the currents and voltages to determine features (in particular features indicative of rates of change of the currents and rates of change of the voltages), and use the determined features as inputs to the phase classifier, the zone classifier, or protection function.

The phase classifier, zone classifier, or protection function may be or may be based on the trained ML model generated by the computing system 15.

Figure 2:
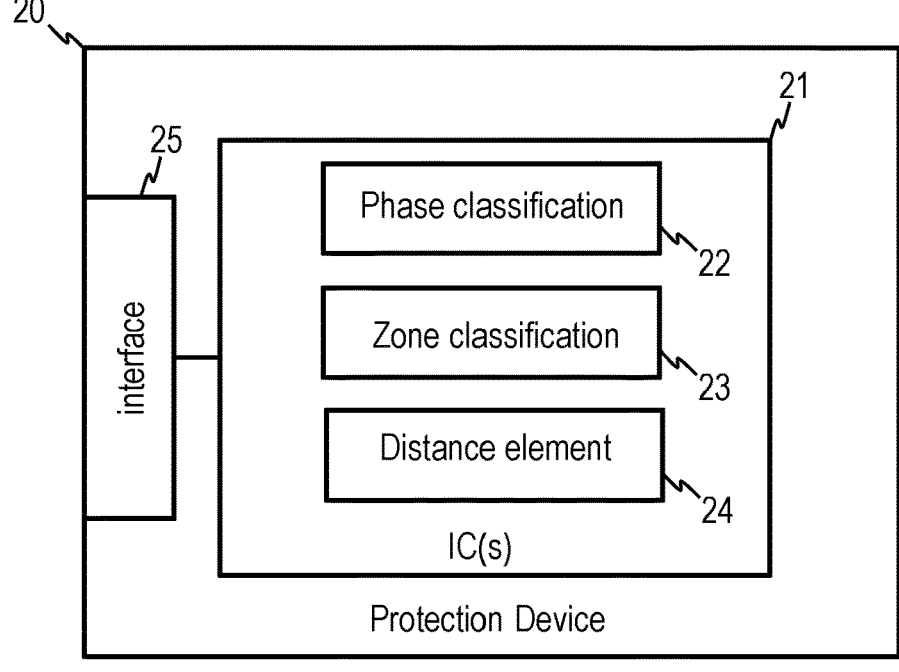
FIG. 2 is a block diagram of a protection device.

FIG. 2 is a block diagram of a protection device 20. The protection device 20 may be a distance relay. The distance relay may be a distance relay for transmission line protection in an electric power system with high penetration of IBRs.

The protection device 20 has an interface 25 to recite voltage(s) and current(s) for one or several phases of the transmission line. The protection device 20 has one or several integrated circuits (IC(s)) 21 that perform processing functions. The one or several IC(s) 21 may include one or several of a processor, a microprocessor, a controller, a microcontroller, a field-programmable gate array (FPGA), an application specific integrated circuit (ASIC) or any combination thereof.

The one or several IC(s) 21 may execute a phase classifier 22. The phase classifier may be operative to classify, responsive to features that depend on currents and voltages of phases of the transmission line 11, a fault into one of the types ABC, A-g, BC, CA-g. The features, which may be determined by the IC(s) 21 from the currents and voltages, may depend on rate of change values of voltages at three phases and rate of change values of currents at the three phases.

The one or several IC(s) 21 may execute a zone classifier 23. The zone classifier may be operative to classify, responsive to features that depend on currents and voltages of phases of the transmission line 11, into one of a plurality of discrete zones (such as zone 1, zone 2). The features, which may be determined by the IC(s) 21 from the currents and voltages, may depend on rate of change values of voltages at three phases and rate of change values of currents at the three phases.

The one or several IC(s) 21 may execute a distance element 24 to perform a distance protection function. The distance element may be operative to determine a corrective response action that is to be performed responsive to features that depend on currents and voltages of phases of the transmission line 11. The features, which may be determined by the IC(s) 21 from the currents and voltages, may depend on rate of change values of voltages at three phases and rate of change values of currents at the three phases.

The features that are used as inputs for the phase classifier 22, the zone classifier 23, or the distance element 24 may be determined from the voltages and currents in the same manner or similarly as explained in association with classifier training below.

The phase classifier 22, the zone classifier 23, or the distance element 24 may be or may be based on trained ML models, as provided by the computing system 15.

Figure 3:
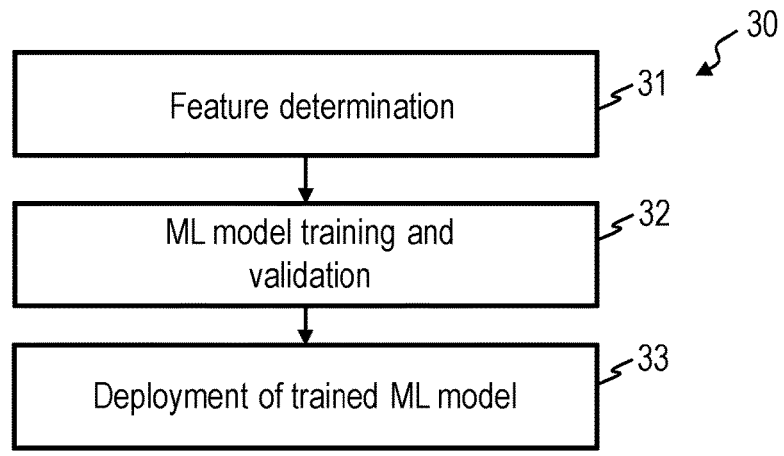
FIG. 3 is a flow chart of a method.

FIG. 3 is a flow chart of a method 30. The method 30 may be performed by the computing system 15. The method 30 may be performed to process the training data 16, to thereby generate a phase classifier and a zone classifier.

At step 31, a feature determination is performed. The feature determination may comprise processing currents and voltages included in the training data 16. The feature determination may comprise determining rates of change of voltages and currents for several phases at times at or close to a fault inception time for the respective lines represented by data in the training data 16. It will be appreciated that the feature determination may respectively performed for each of several distinct scenarios included in the training data 16. The training data 16 may encompass various fault types, fault locations, source to line impedance ratios at terminals A and B, fault resistances, and inception angles.

At step 32, machine learning (ML) model training is performed. The ML model training may be or may comprise a random forest technique. The ML model training may be based on features determined at step 31. The ML model training may utilize features that are indicative of a rate of change of currents and a rate of change of voltages as determined from the scenarios in the training data. When random forest (RF) techniques are used, step 32 may comprise generating a first random forest of first decision trees that implements a phase classifier indicating a type of fault and to generate a second random forest of second decision trees that implements a zone classifier indicating a faulted zone. A number of the first decision trees may be distinct from a number of the second decision trees.

At step 32, a model validation may optionally be performed after training. If the validation fails, the method may loop back to step 31.

At step 33, the trained ML model or a decision logic (such as a classifier or distance protection function) that is based on the trained ML model may be deployed to a distance relay 20 or other protection device 20 for performing a transmission line protection function.

As explained above, the ML training may encompass RF techniques, as exemplarily illustrated with reference to FIG. 4.

Figure 4:
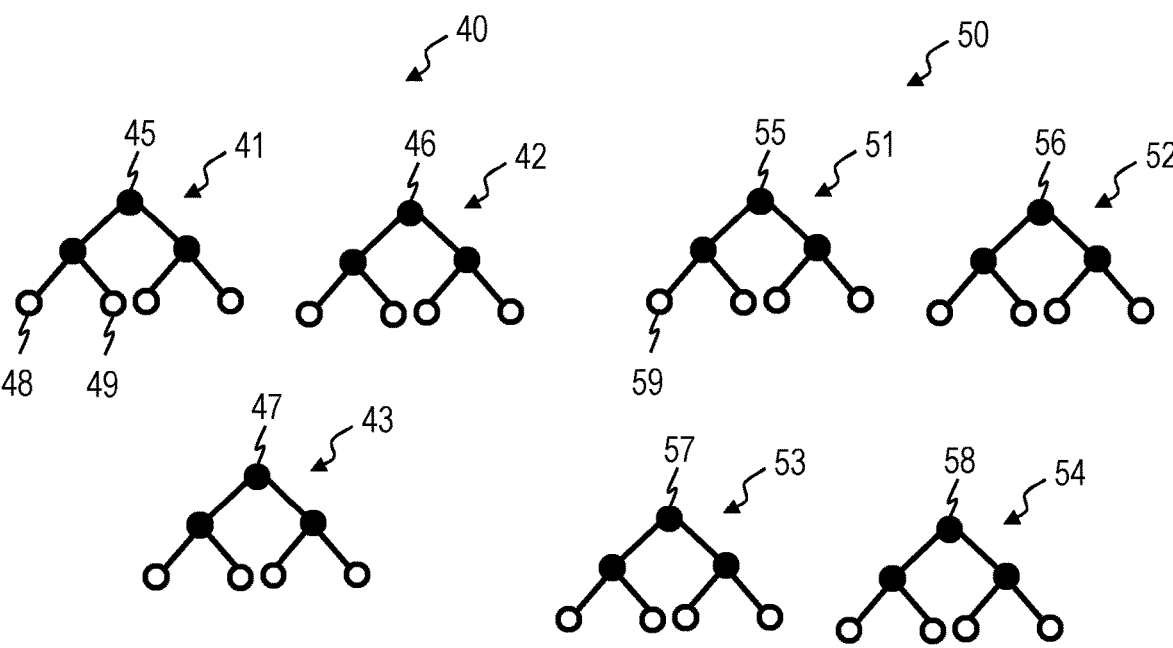
FIG. 4 is a schematic representation of first and second random forests.

FIG. 4 is a schematic diagram showing a first random forest 40 and a second random forest 50. The first random forest 40 may be generated for implementing a phase classifier. The second random forest 50 may be generated for implementing a zone classifier.

The first random forest 40 includes a first plurality of first decision trees 41, 42, 43. Leaf nodes 48, 49 of each first decision tree may be indicative of a fault type. The fault types may be selected from a group consisting of ABC, A-g, BC, CA-g.

Due to the random forest technique, the first random forest 40 includes trees having different features at their root nodes and, similarly, different features at child nodes of the root node etc. For illustration, a first decision tree 41 may have a root node 45 associated with a feature that indicates a rate of change of a voltage VA at a phase of the transmission line 11. Another first decision tree 42 may have a root node 46 associated with a feature that indicates a rate of change of a voltage VB at another phase of the transmission line 11. Yet another first decision tree 43 may have a root node 47 associated with a feature that indicates a rate of change of a current IC at one of the phases of the transmission line 11. Similarly, the nodes further down in the decision trees 41-43 may vary from one decision tree to another in the random forest (but do not need to be distinct for all trees).

The second random forest 50 includes a second plurality of second decision trees 51-54. Leaf nodes 59 of each second decision tree may be indicative of a zone. The zone may be selected from a group consisting of several distinct zones, such as zone 1 and zone 2

Due to the random forest technique, the second random forest 50 includes trees having different features at their root nodes and, similarly, different features at child nodes of the root node etc. For illustration, a second decision tree 51 may have a root node 55 associated with a feature that indicates a rate of change of a voltage VA at a phase of the transmission line 11. Another second decision tree 52 may have a root node 56 associated with a feature that indicates a rate of change of a voltage VB at another phase of the transmission line 11. Yet another second decision tree 53 may have a root node 57 associated with a feature that indicates a rate of change of a current IC at one of the phases of the transmission line 11. Yet another second decision tree 54 may have a root node 58 associated with a feature that indicates a rate of change of a current IA at another one of the phases of the transmission line 11. Similarly, the nodes further down in the decision trees 51-54 may vary from one decision tree to another in the random forest (but do not need to be distinct for all trees).

A number of variables available for splitting at each tree node (i.e., the Mtry hyperparameter) may be different in the first random forest and in the second forest. For illustration, a number of variables available for splitting at each tree node may be greater for the first random forest than for the second random forest.

Figure 5:
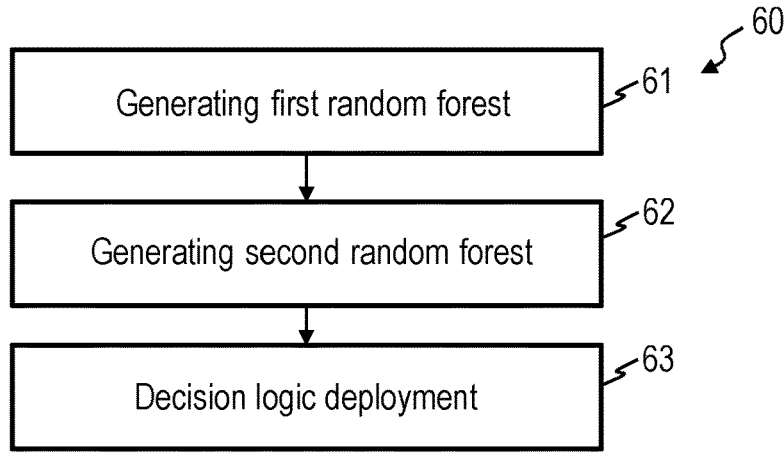
FIG. 5 is a flow chart of a method.

FIG. 5 is a flow chart of a method 60. The method 60 may be performed by the computing system 15. The method 60 may be performed to process the training data 16, to thereby generate a phase classifier and a zone classifier. The method 60 may be performed to implement the ML model training at step 32 and deployment at step 33 of method 30.

At step 61, a first random forest is generated from the training data. Generating the first random forest may comprise
  using features that are indicative of rates of change of currents and rates of change of voltages for the various scenarios in the training data, and
  using the information on the fault type where available for scenarios in the training data.
If information on the fault type is not available for some of the scenarios, they may still be used in generating the first random forest, while applying missing data replacement techniques that iteratively provide improved estimates for missing data (here, the missing fault type). Each first decision tree in the first random forest may include nodes other than leaf nodes that are respectively associated with rates of change of currents and rates of change of voltages for the several phases of a transmission line. Each first decision tree in the first random forest may output a fault type (such as a fault type selected from the group consisting of ABC, A-g, BC, CA-g) for any set of inputs that includes rates of change of currents and rates of change of voltages for the several phases of a transmission line. The first random forest may implement a first ML model that provides a phase classifier for fault classification.

At step 62, a second random forest is generated from the training data. Generating the second random forest may comprise
  using features that are indicative of rates of change of currents and rates of change of voltages for the various scenarios in the training data, and
  using the information on the fault location where available for scenarios in the training data.
If information on the fault location is not available for some of the scenarios, they may still be used in generating the second random forest, while applying missing data replacement techniques that iteratively provide improved estimates for missing data (here, the missing fault location). Each second decision tree in the second random forest may include nodes other than leaf nodes that are respectively associated with rates of change of currents and rates of change of voltages for the several phases of a transmission line. Each second decision tree in the second random forest may output a fault zone (such as a fault zone selected from the group consisting of zone 1, zone 2) for any set of inputs that includes rates of change of currents and rates of change of voltages for the several phases of a transmission line. The second random forest may implement a second ML model that provides a zone classifier for faulted zone classification.

At step 63, an interpretable decision logic (e.g., an interpretable code for distance protection) may be generated and deployed to the protection device. The decision logic may be dependent on the phase classifier and/or the zone classifier.

Figure 6:
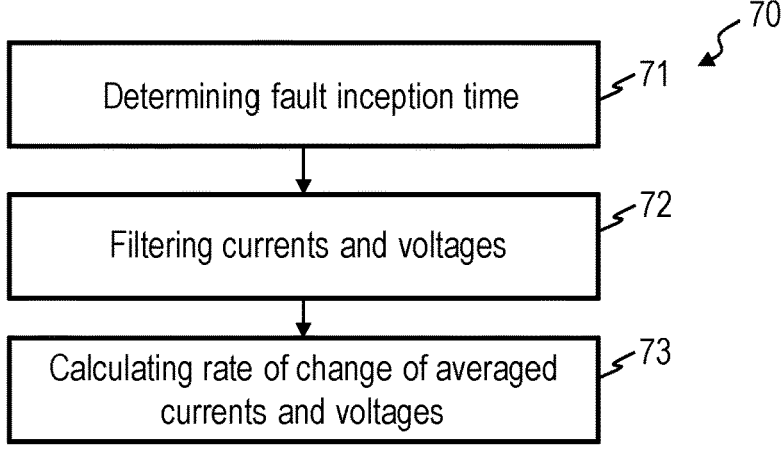
FIG. 6 is a flow chart of a method.

FIG. 6 is a flow chart of a method 70 for determining features that may be used in generating the phase classifier and zone classifier and/or when using the decision logic in the protection device 20. The method 70 may be performed by the computing system 15 and/or the protection device 20.

At step 71, a fault inception time is determined from currents and voltages for several (e.g., three) phases of the transmission line.

At step 72, the currents and voltages are filtered to determine averaged currents and averaged voltages (it being noted that the filtering and averaging happens over time, not across different phases). A moving average filter may be used for the filtering.

At step 73, rates of change of the averaged currents and rates of change of the averaged voltages are calculated. The rates of change of the averaged currents and rates of change of the averaged voltages may be calculated at least for one or several sample times subsequent to a determined fault inception time. For each phase, a rate of change of the averaged voltage may be calculated based on a comparison that compared a value of the averaged voltage for a first sample time with a value of the averaged voltage for a second sample time, with a time difference between the first and second sample times being dependent on a number of samples per cycle used at the filtering at step 72. For each phase, a rate of change of the averaged current may be calculated based on a comparison that compared a value of the averaged current for a first sample time with a value of the averaged current for a second sample time, with a time difference between the first and second sample times being dependent on a number of samples per cycle used at the filtering at step 72.

The rates of change for sample time(s) subsequent to the fault inception time are used for ML model training by the computing system 15 prior to field operation of the decision logic, or for determining the features input into the phase classifier 22, zone classifier 23, and/or distance element 24 by the protection device 20 during field operation.

Figure 7:
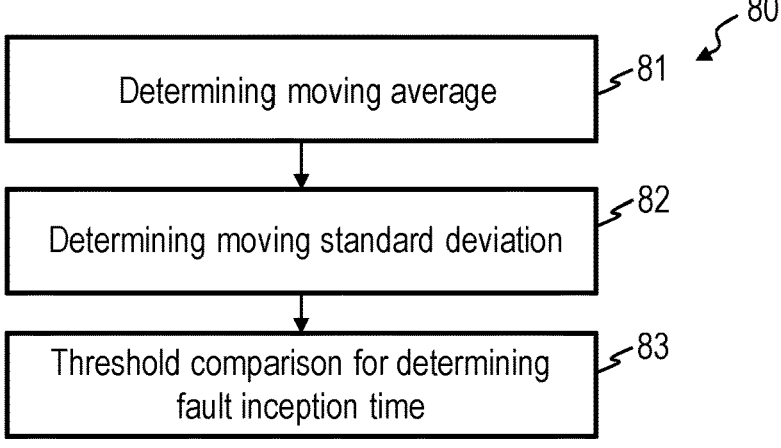
FIG. 7 is a flow chart of a method.

FIG. 7 is a flow chart of a method 80 for determining a fault inception time. The method 80 may be employed to determine fault inception times for scenarios in the training data 16 when processing the training data 16 to generate a phase classifier and zone classifier. The method 80 may be employed in the protection device 20 to generate features for inputting into the phase classifier 22, zone classifier 23, and/or distance element 24.

At step 81, a moving average of a voltage is determined and a moving average of a current is determined. This may be done for every phase of a transmission line for which a fault scenario is provided in the training data 16. A sliding window technique may be employed to determine the moving averages.

At step 82, a moving standard deviation of the voltage is determined and a moving standard deviation of the current is determined. This may be done for every phase of a transmission line for which a fault scenario is provided in the training data 16. A sliding window technique may be employed to determine the moving standard deviations.

At step 83, a threshold comparison may be performed to determine a fault inception time. A modulus of a difference between voltage and averaged voltage may be compared to a first threshold. The first threshold may be a constant times the moving standard deviation for the voltage. A modulus of a difference between current and averaged current may be compared to a second threshold. The second threshold may be a constant times the moving standard deviation for the current. The earlier one of the times at which the first or second threshold comparison shows that the modulus of the difference exceeds the associated threshold may be considered as fault start point or fault inception time.

Feature Determination

A detailed embodiment of a feature determination will be provided below. The feature determination may be performed for determining features that may be used in generating the phase classifier and zone classifier and/or when using the decision logic in the protection device 20. The feature determination may be performed by the computing system 15 and/or the protection device 20.

The feature determination may operate with three phase voltage and current signals. Steps performed in preparing the features are explained below.

Step 1: Determining Fault Inception Time

Line voltages and currents are monitored continually (i.e., in an ongoing basis). The line voltages and currents may be continuously monitored. For the training data 16, the respective data is available in the fault scenarios in the training data. The line voltages and currents are processed to determine the fault inception time. This may be done using A-D below:

A one-sample difference (i.e., difference between consecutive samples) of three phase voltage and current signals are computed (e.g., continuously, for various sample times)

$$V_{diff}(k)=V(k)-V(k-1) \tag{1}$$

$$I_{diff}(k)=I(k)-I(k-1) \tag{2}$$

A moving average and standard deviation of sliding window of size w are computed (e.g., continuously, for each sample time):

$$V_{avg}(k)=\text{mean}(V[k-w:k])V_{sd}(k)=sd(V[k-w:k]) \tag{3}$$

$$I_{avg}(k)=\text{mean}(I[k-w:k])I_{sd}(k)=sd(I[k-w:k]) \tag{4}$$

Here, w denotes a sliding window size. The sliding window size w may be adapted so as to improve the accuracy of the trained ML model. sd denotes the standard deviation. mean denotes an averaging function to calculate a mean value.

Fault start time for each phase voltage and current is identified when $$|V(k)-V_{avg}(k-1)|>c*V_{sd}(k-1) \tag{5}$$

$$|I(k)-I_{avg}(k-1)|>c*I_{sd}(k-1) \tag{6}$$

Thus, threshold comparisons of Equations (5) and (6) are performed for the deviation from the moving average. The threshold (on the right-hand side of Equations (5) and (6)) may be dependent on the moving standard deviation. c is a constant with may be the same in Equations (5) and (6) or which may be different in Equations (5) and (6).

Figure 8:
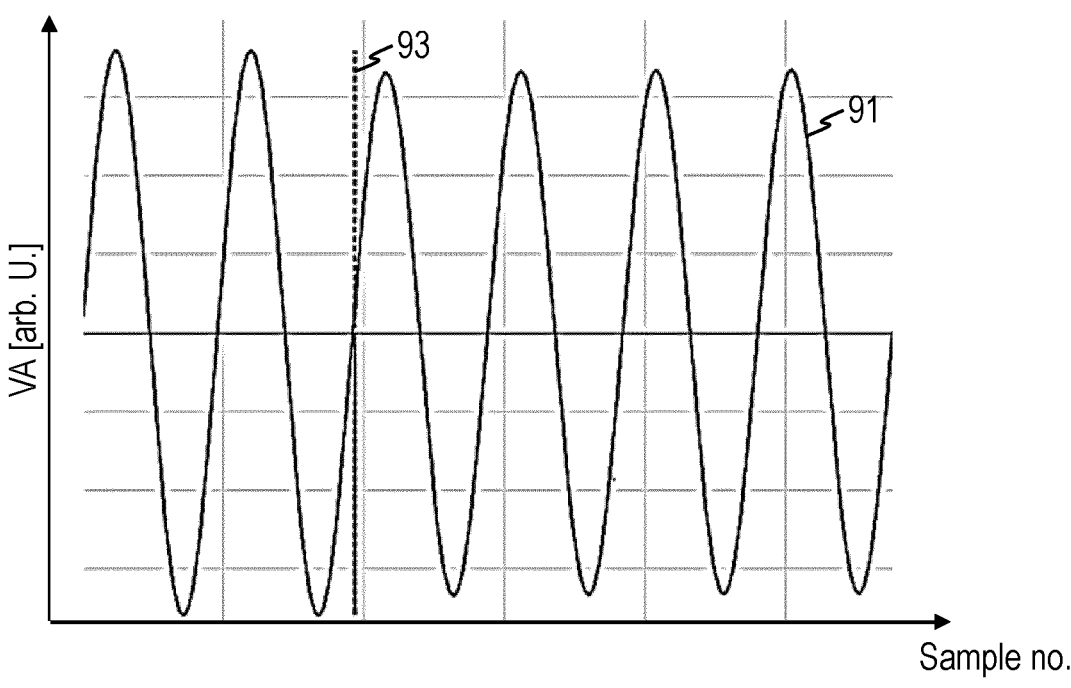
FIGS. 8 and 9 are diagrams of a voltage and current in a phase of a faulted transmission line.
Figure 9:
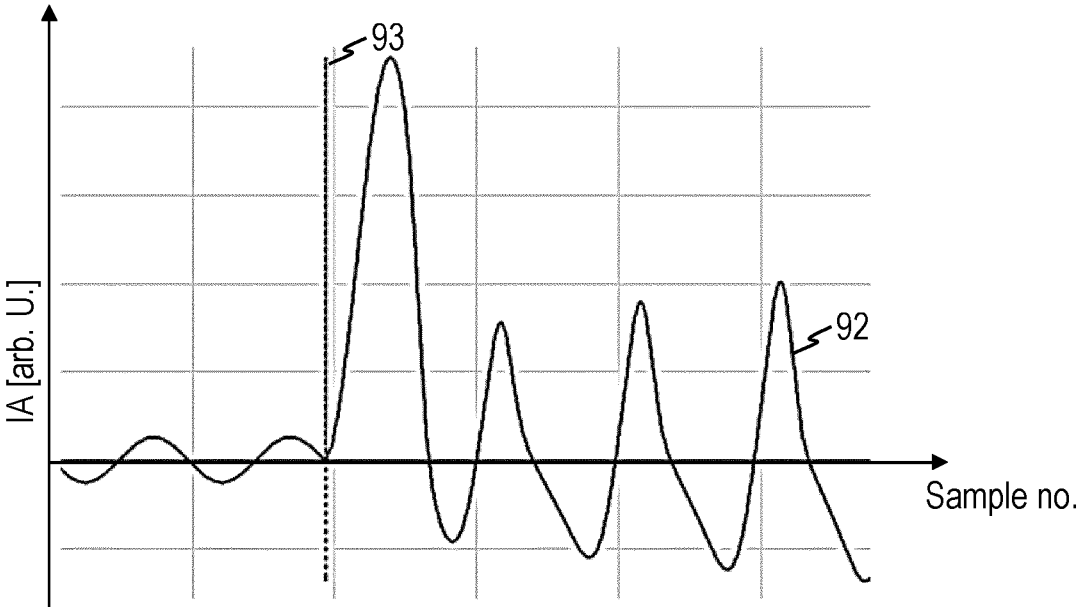

Smallest of each phase voltage and current fault start point is considered as the fault start point FIGS. 8 and 9 show a voltage 91 and current 92 for a phase of a transmission line. At a time or sample 93, the current 92 fulfills the threshold criterion (6). This marks the fault inception time for this phase.

Step 2: Moving Average Filter

Each phase voltage and current are processed through a moving average filter to remove unwanted ripples. This may be done according to $$V_{avg}(k) = \frac{1}{N}\sum\nolimits_{l=k}^{k-N+1}V(l) \tag{7}$$

$$I_{avg}(k) = \frac{1}{N}\sum\nolimits_{l=k}^{k-N+1}I(l) \tag{8}$$

where N is the number of samples per cycle, k is the sample number.

Step 3: Rate of Change Determination

The rate of change of voltage ($\Delta V$) and current ($\Delta I$) for each phase is determined. This may be done using the following relationship $$\Delta V_{avg}(k)=V_{avg}(k)-V_{avg}(k-N) \tag{9}$$

$$\Delta I_{avg}(k)=I_{avg}(k)-I_{avg}(k-N) \tag{10}$$

Note that the difference on the right-hand side of Equations (9) and (10) depends on the number N of samples per cycle used in the preceding filtering.

Step 4: Sample Values

Several (e.g., four) distinct samples (e.g., samples 3, 5, 7, 9 after fault start point) of the rate of change of voltage ($\Delta V_{avg}$) and current ($\Delta I_{avg}$) may be taken for each phase from the instance of fault start point detected from the Step 1.

The sample values of the rate of change that are used for generating a decision logic may be selected from samples times that are taken from up to a quarter cycle after the fault inception time. The sample values that are used for generating a decision logic may be selected from samples times that are not taken from times after a quarter cycle after the fault inception time.

Step 5: Variation Calculation

The variation of each phase voltage and currents using the below relation $$\Delta V_{diff}(k)=\Delta V_{avg}(k)-\Delta V_{avg}(k-1) \tag{11}$$

$$\Delta I_{diff}(k)=\Delta I_{avg}(k)-\Delta I_{avg}(k-1) \tag{12}$$

Random Forest Model Training

The features determined as explained above may be used for random forest (RF) model training This may comprise developing two RF classification models:

Phase Classification Model—for Fault Classification

Input: [$\Delta VA_{diff}$(k), $\Delta VB_{diff}$(k), $\Delta VC_{diff}$(k), $\Delta IA_{diff}$(k), $\Delta IB_{diff}$(k), $\Delta IC_{diff}$(k)]

Output: [Fault Type (ABC, A-g, BC, CA-g)]

Zone Classification Model—for Faulted Zone Identification

Input: [$\Delta VA_{diff}$(k), $\Delta VB_{diff}$(k), $\Delta VC_{diff}$(k), $\Delta IA_{diff}$(k), $\Delta IB_{diff}$(k), $\Delta IC_{diff}$(k)]

Output: [Zone (Zone1, Zone2)]

The random forest model training may be performed based on the training data, using the features determined as explained above and, at least, the fault type and faulted zone information included in the training data.

EXAMPLE

Training Dataset

To train and validate a RF model, a total of 9072 scenarios of line faults are simulated using Power System CAD (PSCAD)/EMTDC software. These scenarios are simulated to cover a range of possible combination of line faults in terms various loads, fault locations, SIR, fault resistances, inception angles. The coverage of these various scenarios is summarized in Table 1.

TABLE 1

Dataset coverage

| Parameter | Variations |
|---|---|
| Load (%) | 0, 40, 80, 125 |
| Fault Type | ABC-g, A-g, BC-g, CA-g |
| Fault location (% of line length) | 2, 20, 40, 64, 76, 84, 95 |
| Source to line impedance ratio at terminal A (SIRA) | 0.1, 0.5, 1 |
| Source to line impedance ratio at terminal B (SIRB) | 0.5 |
| Fault resistance (Ω) | 0.1, 5, 20 |
| Inception angle (degree) | 0, 15, 30, 60, 90, 120, 135, 210, 270 |

RF Model Training

A total of 27216 samples covering 9072 fault variations are used for training. A first RF model and a second RF model are trained. A cross-validation technique are used to identify the best parameters (such as number of trees) for both RF classification models. Identified parameters along with inputs and targets considered are provided in Table 2.

TABLE 2

Parameters of RF models

| Model | Number of Trees | Mtry |
|---|---|---|
| Phase Classification Model | 5 | 6 |
| Zone Classification Model | 25 | 3 |

Mtry is the number of variables available for splitting at each tree node.

Model Validation k-Fold cross-validation along with majority voting technique is used to validate the performance of the fitted RF classifier models. The set of observations is randomly divided into k groups, or folds, of approximately equal size. The first fold is treated as a validation set, and the XGBoost model is fitted using the remaining k−1 folds. The misclassification error is then computed on the held-out fold. To compute the misclassification error, output is assigned to a class, which is computed as majority voting of predicted observation class.k estimates of test errors are computed by repeating this procedure k times. Each time, a different set of observations is treated as a validation set.

Figure 10:
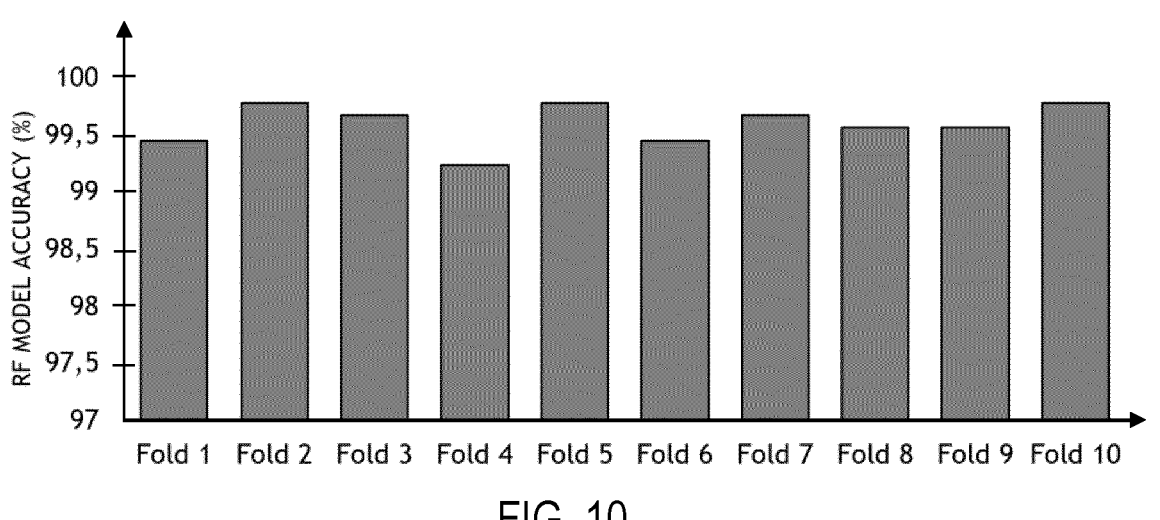
FIG. 10 is a diagram of an accuracy of a phase classifier in 10-fold cross validation.

Phase Classification Model: The faulted phase classification Random Forest model (i.e., the phase classifier) is validated with 10-fold cross validation. Total classification accuracy obtained for each fold is shown in FIG. 10. Average producer's and user's accuracy with respect to each fault type class are provided in FIGS. 11 and 12, respectively.

Figure 13:
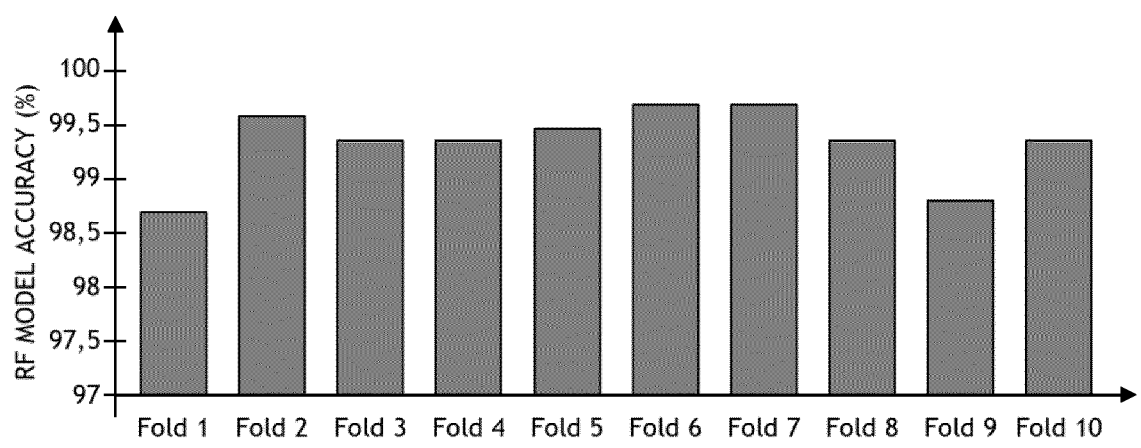
FIG. 13 is a diagram of an accuracy of a zone classifier in 10-fold cross validation.

Zone Classification Model: The faulted zone classification Random Forest model (i.e., the zone classifier) is validated with 10-fold cross validation. Total classification accuracy obtained for each fold is shown in FIG. 13. Average producer's and user's accuracy with respect to each zone prediction class are provided in FIGS. 14 and 15, respectively.

Figure 11:
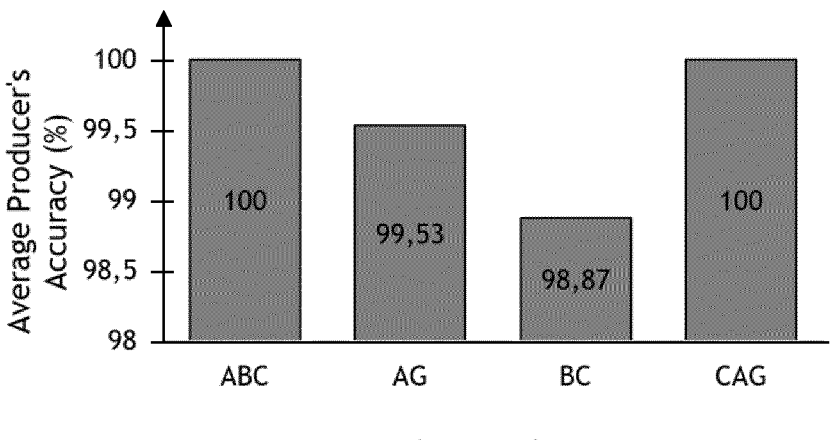
FIGS. 11 and 12 are diagrams of average producer's and user's accuracies of the phase classifier.
Figure 12:
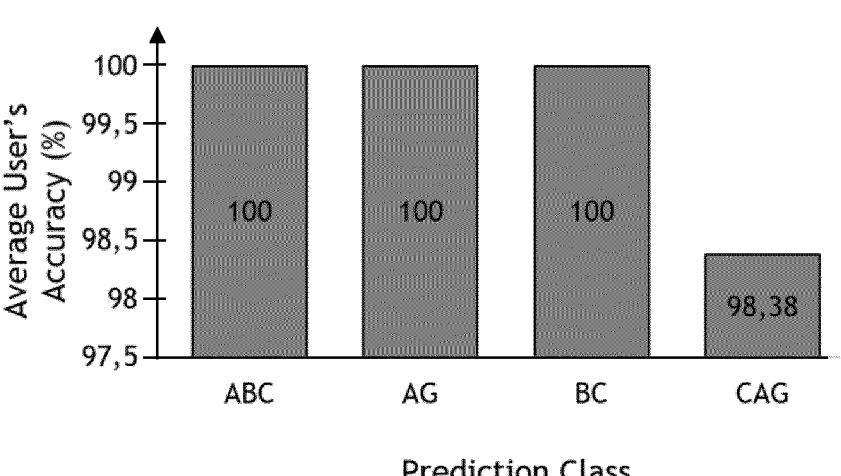
Figure 14:
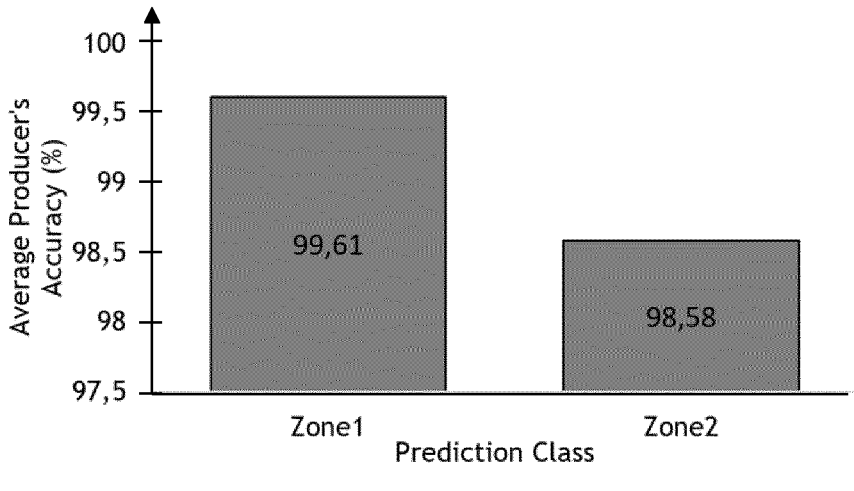
FIGS. 14 and 15 are diagrams of average producer's and user's accuracies of the zone classifier.
Figure 15:
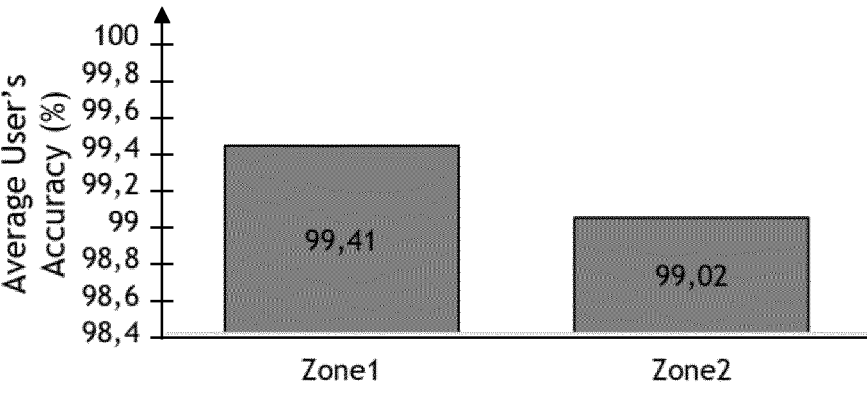

As shown by FIGS. 10 to 12, a fault classification with an average accuracy of 99.59% can be attained, within 3-5 msec after a disturbance. As shown by FIGS. 13 to 15, a fault zone identification with an average accuracy of 99.3% can be attained within 3-5 msec after a disturbance.

The techniques of embodiments provide a ML/AI-based technique that is interpretable and can be used to generate the protection logic as shown in below diagram. The generated protection logic can be loaded into a protection IED.

Protection devices, methods, and systems according to embodiments provide various effects. Fault inception time identification can be performed accurately. Smart data window selection (e.g., by determining a rate of change of voltages and currents based on a difference of sample times that depends on a number of samples per cycle used in a preceding filtering step) contribute to improved accuracy of faulted phase and zone identification.

The protection devices, methods, and systems provide a technique that is system independent and easy to generate the protection logic. The protection logic is interpretable and easy to implement in IEDs. Accurate and fast fault and zone classification can be performed. The protection devices, methods, and systems are suitable for use with IBR systems, without being limited thereto.

The devices, methods, and systems according to embodiments provide results that are both accurate and robust.

The devices, methods, and systems according to embodiments may be used to provide distance protection for transmission networks in an electric grid that includes renewable energy sources or other inverter-based resources.

While the invention has been described in detail in the drawings and foregoing description, such description is to be considered illustrative or exemplary and not restrictive. Variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

The invention claimed is:

1. A computer-implemented method comprising:
computing features for use in generating a decision logic operative to generate a signal operative for use with a power system, wherein computing the features comprises
determining a fault inception time from at least one electric characteristics of data sampled for a given type of power system, and
determining rate of change values indicative of a rate of change of the at least one electric characteristics for at least one sample time, the at least one sample time being dependent on the fault inception time;
using the features to generate the decision logic, wherein using the features to generate the decision logic comprises performing a machine learning (ML) model training using the computed features to generate one or both of a phase classifier and a zone classifier, wherein the phase classifier receives rates of change of voltages for three phases and rates of change of currents for the three phases as inputs and outputs a fault type, and/or wherein the zone classifier receives rates of change of voltages for three phases and rates of change of currents for the three phases as inputs and outputs a zone; and
deploying the decision logic to an intelligent electronic device (IED) to generate the signal.

2. The computer-implemented method of claim 1, wherein the ML model has an input layer that receives the rate of change values.

3. The computer-implemented method of claim 1, wherein the decision logic is or comprises at least one of:
a protection function;
the phase classifier for fault classification; or
the zone classifier for faulted zone identification.

4. The computer-implemented method of claim 1, wherein the signal is at least one of:
a circuit breaker control signal;
a switch control signal;
an alarm;
a warning;
status information; or
output for outputting via a human machine interface (HMI).

5. The computer-implemented method of claim 1, wherein determining the rate of change values comprises, for each phase,
determining a filtered voltage,
determining a filtered current, and
calculating the rate of change values from the filtered voltage and from the filtered current.

6. The computer-implemented method of claim 5, wherein the filtered voltage is determined by averaging a number N>1 of sample values of the voltage and the filtered current is determined by averaging a number N>1 of sample values of the current.

7. The computer-implemented method of claim 6, wherein calculating the rate of change values comprises determining
a voltage difference between a sample value of the filtered voltage at a time k and a sample value of the filtered voltage at a time k-N, and
a current difference between a sample value of the filtered current at a time k and a sample value of the filtered current at a time k-N, and
wherein
the rate of change values for the voltage are determined as a change of the voltage difference between a sample time and a previous sample time, and
the rate of change values for the current are determined as a change of the current difference between the sample time and the previous sample time.

8. The computer-implemented method of claim 1, wherein deploying the decision logic comprises deploying the phase classifier and/or the zone classifier for execution by the IED for distance protection.

9. The computer-implemented method of claim 1, wherein generating the decision logic comprises using the computed features to generate one or both of the phase classifier and the zone classifier.

10. The computer-implemented method of claim 9,
wherein using the computed features to generate the decision logic comprises generating the phase classifier and generating the zone classifier using an ensemble machine learning (ML) method, and/or wherein generating the phase classifier and generating the zone classifier comprises a random forest training using the computed features to generate a random forest, and/or wherein using the rate of change values to generate one or both of the phase classifier and the zone classifier comprises training a first machine learning model, using the computed features, to generate the phase classifier, and training a second machine learning model, using the computed features, to generate the zone classifier.

11. The computer-implemented method of claim 1, wherein the phase classifier and/or zone classifier are generated in a self-setting manner.

12. The computer-implemented method of claim 1, wherein the phase classifier and/or zone classifier are continually updated during field operation.

13. The computer-implemented method of claim 1, wherein the decision logic is a decision logic for transmission line protection, and/or wherein generating the phase classifier and/or zone classifier is performed using a dataset including data for several distinct source to line impedances.

14. An intelligent electronic device (IED) comprising:

an interface to receive a voltage and/or current for at least one phase of a power transmission line;

wherein the IED is operative to determine a rate of change of at least one electric characteristics and to input the determined rate of change of the at least one electric characteristics as input into a decision logic that has been generated and deployed to the IED according to the computer-implemented method of claim 1.

15. An electric power system, comprising:

a power transmission line; and the IED of claim 14 operative to perform a distance protection function for the power transmission line.

16. A computer-implemented method comprising:

computing features for use in generating a decision logic operative to generate a signal operative for use with a power system, wherein computing the features comprises determining a fault inception time from at least one electric characteristics of data sampled for a given type of power system, wherein the fault inception time is identified as earlier one of a time at which a modulus of a deviation of a voltage from a sliding window moving average of the voltage reaches or exceeds a phase-specific voltage threshold and a time at which a modulus of a deviation of a current from a sliding window moving average of the current reaches or exceeds a phase-specific current threshold, and determining rate of change values indicative of a rate of change of the at least one electric characteristics for at least one sample time, the at least one sample time being dependent on the fault inception time;

using the features to generate the decision logic; and deploying the decision logic to an intelligent electronic device (IED) to generate the signal.

17. A computer-implemented method comprising:

computing features for use in generating a decision logic operative to generate a signal operative for use with a power system, wherein computing the features comprises determining a fault inception time from at least one electric characteristics of data sampled for a given type of power system, wherein determining the fault inception time comprises determining a sliding window moving average and comparing a modulus of a deviation of the at least one electric characteristic from the sliding window moving average to at least one threshold, and determining rate of change values indicative of a rate of change of the at least one electric characteristics for at least one sample time, the at least one sample time being dependent on the fault inception time;

using the features to generate the decision logic; and deploying the decision logic to an intelligent electronic device (IED) to generate the signal.

18. The computer-implemented method of claim 17, further including:

determining a sliding window standard deviation of the at least one electric characteristic, wherein the at least one threshold depends on the sliding window standard deviation, and/or wherein the fault inception time is identified as earlier one of a time at which a modulus of a deviation of a voltage from a sliding window moving average of the voltage reaches or exceeds a phase-specific voltage threshold and a time at which a modulus of a deviation of a current from a sliding window moving average of the current reaches or exceeds a phase-specific current threshold.

* * * * *